United States Patent [19]
Jung et al.

[11] Patent Number: 5,376,570
[45] Date of Patent: Dec. 27, 1994

[54] TRANSISTOR HAVING A NONUNIFORM DOPING CHANNEL AND METHOD FOR FABRICATING THE SAME

[75] Inventors: Dae S. Jung; Bong K. Joo; Sang Y. Kim; Han S. Yoon, all of Bubaleub, Rep. of Korea

[73] Assignee: Hyundai Electronics Industries Co., Ltd., Rep. of Korea

[21] Appl. No.: 160,684

[22] Filed: Dec. 2, 1993

[30] Foreign Application Priority Data

Dec. 2, 1992 [KR] Rep. of Korea ............... 1992-23083

[51] Int. Cl.$^5$ ........................................... H01L 21/265
[52] U.S. Cl. ........................................ 437/41; 437/44; 437/45; 437/59; 437/203
[58] Field of Search ................. 437/41, 44, 45, 57, 437/58, 59, 203; 257/330, 344, 408

[56] References Cited

U.S. PATENT DOCUMENTS

| | | | |
|---|---|---|---|
| 4,962,054 | 10/1990 | Shimata | 437/45 |
| 5,071,780 | 12/1991 | Tsai | 437/44 |
| 5,082,794 | 1/1992 | Pfiester et al. | 437/44 |
| 5,132,238 | 7/1992 | Mirakami et al. | 437/44 |
| 5,160,491 | 11/1992 | Mori | 437/203 |
| 5,270,257 | 12/1993 | Shin | 437/44 |

Primary Examiner—Brian E. Hearn
Assistant Examiner—Kevin M. Picardai
Attorney, Agent, or Firm—Merchant, Gould, Smith, Edell, Welter & Schmidt

[57] ABSTRACT

An MOSFET having a nonuniform doping channel and a method for fabricating the same.

The MOS transistor having a nonuniform doping channel is comprised of: a gate oxide film formed on a semiconductor substrate provided with a trench; a gate electrode of some size formed on the gate oxide film atop the trench and surroundings, the gate electrode having a portion longer than any other than portion and thus, being asymmetrical with regard to the axis passing the center of the trench; a source region formed in a predetermined portion of the semiconductor substrate neighboring a short portion of the gate electrode; a high density channel region formed by doping impurities having the same type with the semiconductor substrate in a predetermined portion of the semiconductor substrate below a longer portion of the gate electrode; and a drain region formed in a predetermined portion of the semiconductor substrate neighboring the high density channel region.

2 Claims, 4 Drawing Sheets

TRANSISTOR HAVING A NONUNIFORM DOPING CHANNEL AND METHOD FOR FABRICATING THE SAME

BACKGROUND OF THE INVENTION

1. Field of the Invention

The present invention relates, in general, to a metal-oxide-semiconductor field-effect-transistor (hereinafter "MOSFET"), which is generally employed in variety of semiconductor articles, and more particularly to an MOSFET having a nonuniform doping channel and a method for fabricating the same.

2. Description of the Prior Art

Hereinafter, description for a conventional lightly doped drain (hereinafter "LDD") MOSFET is to be, in brief, described for the better understanding of the invention with reference to FIG. 1, wherein reference numeral 1 designates a semiconductor substrate while reference numerals 2, 3, 4a; , 4b, 5a, 5b, 6, 7a, and 7b designate a channel, a gate oxide film, a high density source region, a high density drain region, a low density source region, a low density drain region, a gate electrode, a source electrode and a drain electrode, respectively.

A method for fabricating a submicron semiconductor device is required to maintain the high performance thereof as well as to secure the device reliability, scaling down the semiconductor device.

In particular, as this miniaturization proceeds toward nigher integration density, physical limits are generated. For example, device characteristics caused by the shortage of the thickness of the gate oxide film and the channel length, such as short channel effect, drain induced barrier lowering and punch through is deteriorated, so that the normal operation of the device cannot performed.

In order to unravel the above problems, an effort has been made such that the density of impurity ions for the channel is increased. However, this solution method causes the mobility of electron to be reduced, degenerating the transconductance (the ratio of the change of gate current to the change of gate voltage) of channel, the electric current characteristics and the device reliability.

SUMMARY OF THE INVENTION

Therefore, an object of the present invention is to solve the aforementioned problems encountered with the prior arts and to provide an MOSFET having a nonuniform doping channel, preventive of the reduction of the transconductance and the electric current characteristics and improved in the channel length and the punch through characteristics, and a method for the fabrication of the same.

In accordance with an aspect of the present invention, this object can be accomplished by the provision of a transistor having a nonuniform doping channel, comprising of: a gate oxide film formed on a semiconductor substrate provided with a trench; a gate electrode of predetermined size formed on the gate oxide film atop the trench and its surroundings, the gate electrode having a portion longer than any other than portion and thus, being asymmetrical with regard to the axis passing the center of the trench; a source region formed in a predetermined portion of the semiconductor substrate neighboring a short portion of the gate electrode; a high density channel region formed by doping impurities having the same type with the semiconductor substrate in a predetermined portion of the semiconductor substrate below a longer portion of the gate electrode; and a drain region formed in a predetermined portion of the semiconductor substrate neighboring the high density channel region, In accordance with another aspect of the present invention, the above object can be accomplished by the provision of a method for fabricating a transistor, comprising the steps of: forming a buffer oxide film on a semiconductor substrate which is sectioned into a device separation region and an active region by the formation of a field oxide film thereon; doping the semiconductor substrate lightly with high density impurities having the same type with the semiconductor substrate to form a high density channel region; forming a trench in the high density channel region atop the semiconductor substrate in such a depth as to expose the semiconductor substrate slightly; forming a gate oxide film over the exposed semiconductor substrate in the trench and over the high density channel region; depositing a polysilicon film entirely over the gate oxide film; patterning the polysilicon film to form a gate electrode of predetermined size on the gate oxide film atop the trench and its external surroundings, the polysilicon film extending differently to the external surroundings and thus, being asymmetrical; doping the high density channel region with high density impurities having a type different from that of the semiconductor substrate 1 so as to form a source region and a drain region and so as not to implant the different impurities in the high density channel portion of the semiconductor substrate formed below the longer extended portion of the gate electrode, the drain region being neighboring the high density channel portion.

DETAILED DESCRIPTION OF THE PREFERRED EMBODIMENT

Figure 1:
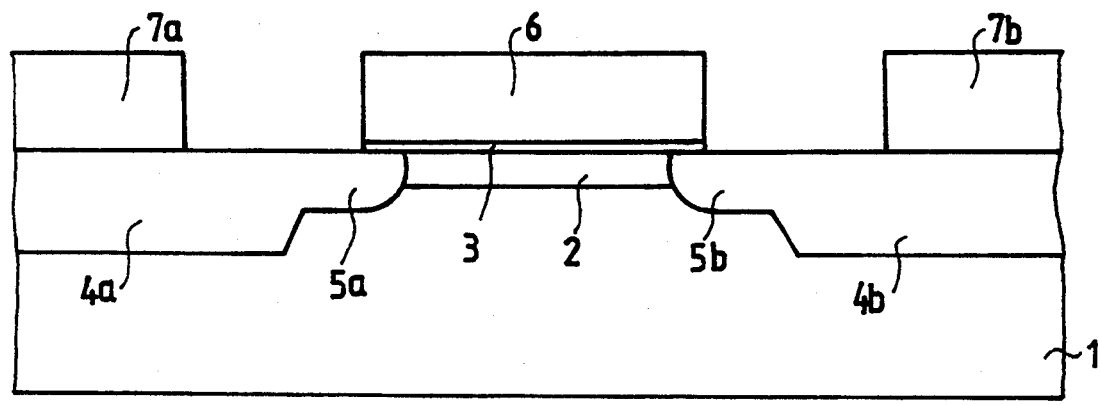
FIG. 1 is a schematic, cross-sectional view of structure illustrating a conventional MOSFET.

Hereinafter, the preferred embodiment of the present invention is to be in detail described with reference to some figures, wherein like reference numerals designate like parts, respectively.

Figure 2:
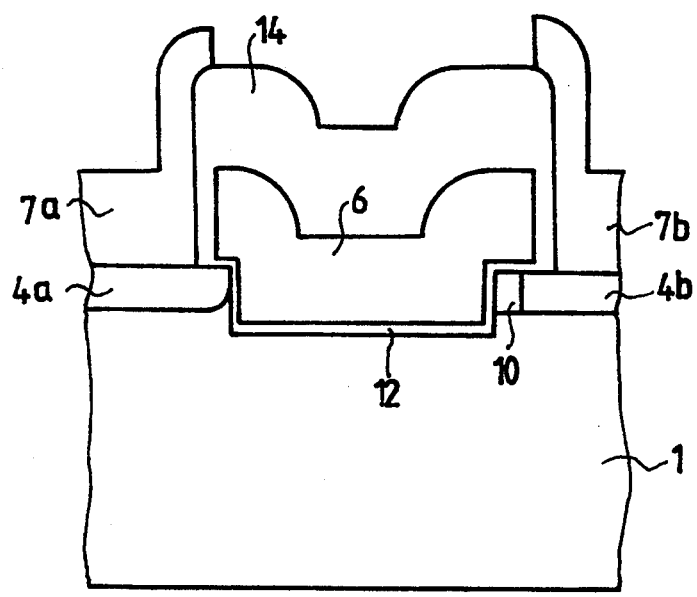
FIG. 2 is a schematic, cross-sectional view of structure of a MOSFET according to the present invention.

Referring initially to FIG. 2, there is a schematic, cross-sectional view showing the structure of an MOSFET according to the present invention. The inventive MOSFET has a nonuniform doping channel, which is preventive of the reduction of the transconductance and the electric current characteristics and improved in the channel length and the punch through characteristics, comprising a semiconductor substrate 1 having a trench 11 covered with a gate oxide film 12; a gate electrode 6 of predetermined size formed in the trench 11 and extended to the outer of the trench 11, having a portion longer than any other than portion and thus, being asymmetrical with regard to the axis passing the center of the trench; a source region 4a formed in the semiconductor substrate 1 neighboring the relatively short portion of the extended gate electrode 6; a high density channel region 10 formed by implanting impurities having the same type with the semiconductor substrate 1 in a predetermined portion of the semiconductor substrate below the relatively long portion of the extended gate electrode 6; and a drain region 4b formed in a predetermined portion of the semiconductor substrate 1 neighboring the high density channel region 10.

Description for a method for fabricating the MOSFET according to the present invention will be given next by reference to FIGS. 3A and 3F, which illustrate the fabrication steps, respectively.

Figure 3A:
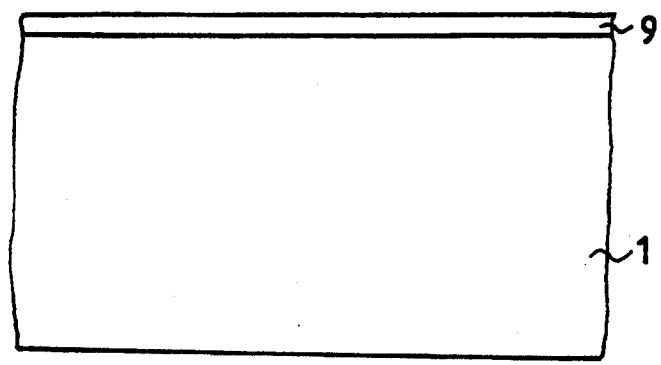
FIGS. 3A–F are schematic, cross-sectional views illustrating a method of fabrication of a MOSFET according to the present invention.

First, a semiconductor substrate 1 is sectioned into an active region and device separation region by a field oxide film, followed by the deposition of a buffer oxide film 9 over the active region, as shown in FIG. 3A.

Figure 3B:
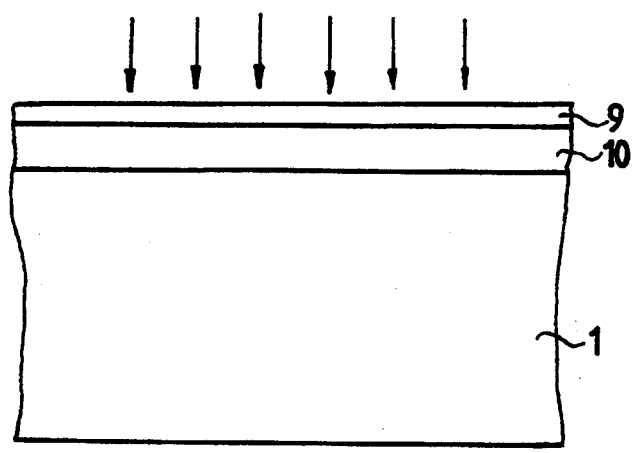

Next, high density impurities which has the same type with the semiconductor substrate are lightly implanted, as indicated by arrows, in the semiconductor substrate 1 in order to control the threshold voltage, forming a high density channel region in the semiconductor substrate, as shown in FIG. 3B.

Figure 3C:
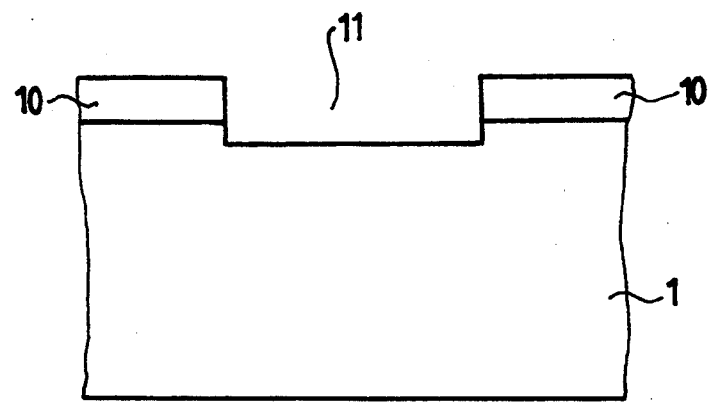

FIG. 3C shows a trench 11 which is formed in the high density channel region 10 atop the semiconductor substrate 1, separating one channel region 10 into two regions and exposing the semiconductor substrate partially therethrough.

Figure 3D:
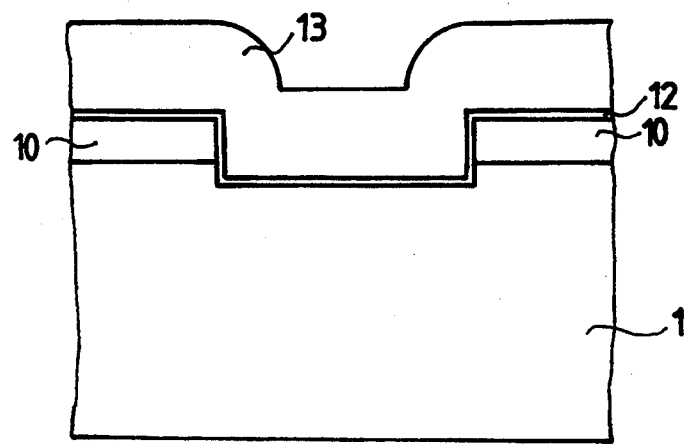

Subsequently, over the semiconductor substrate 1 exposed due to the formation of the high density channel region 10 and the trench region 11 is formed a gate oxide film 12 which is then, covered with a polysilicon film 13, as shown in FIG. 3D.

Figure 3E:
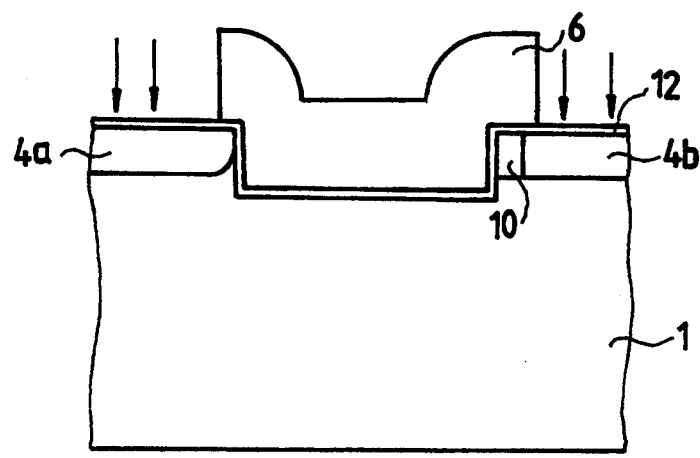

Referring now to FIG. 3E, there is illustrated the process of forming a gate electrode and source/drain regions. For this, the polysilicon film 13 is initially subjected to the treatment of patterning so as to form a gate electrode 6 which is asymmetrical with regard to the central axis of the trench and then, high density impurities which have a type different from that of the semiconductor substrate 1 are implanted, as indicated by arrows, in the high density channel region 10 to form a source 4a and a drain region 4b which are then subjected to thermal treatment. The patterning is carried out to form a pattern which covers all the polysilicon film 13 but the trench region and its surroundings. Using this pattern, an etch process is applied to the polysilicon film 13 to form on the gate oxide film 12 the gate electrode 6, which covers the one channel region 10 separated much and the other channel region 10 separated less as well as the trench region, resulting in an asymmetrical form, as shown in FIG. 3E.

When the different type impurities in the high density channel region 10 are implanted to form the source region 4a and the drain region 4b, the high density channel region 10 remains beside the drain region 4b, maintaining the same type with the semiconductor substrate 1. This remaining, identical typed, high density channel region is capable of controlling the threshold voltage and preventing the punch through.

Figure 3F:
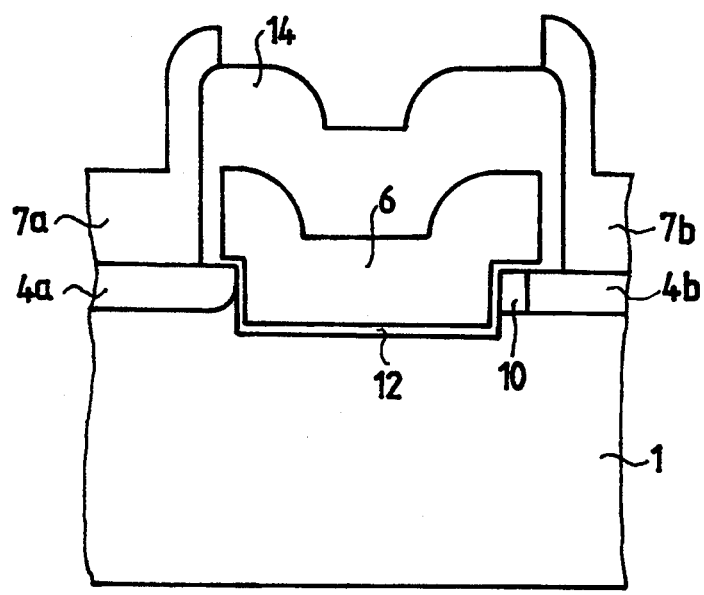

Finally, in order to insulate the gate electrode 6, the resulting structure is entirely coated with an oxide film which is then subjected to the treatment of patterning to form a gate insulating oxide film 14, and thereafter a source electrode 7a and a drain electrode 7b are formed, as shown in FIG. 3F.

The inventive MOSFET employing such trench structure has a channel longer than the conventional LDD structure. In addition, impurities are uniformly and lightly implanted in all semiconductor substrate regions except for the drain region, so that transconductance and current reduction can be prevented in accordance with the present invention. Furthermore, with the structure and the above advantages according to the present invention, the short channel effect and the punch through are improved, resulting in the enhancement of the device reliability.

What is claimed is:

1. A method for fabricating a transistor having a nonuniform channel, comprising the steps of:

forming a buffer oxide film on a semiconductor substrate which is sectioned into a device separation region and an active region by the formation of a field oxide film thereon;

doping said semi conductor substrate lightly with high density impurities having the same type with said semiconductor substrate to form a high density channel region;

forming a trench in said high density channel region atop said semiconductor substrate in such a depth as to expose said semiconductor substrate slightly;

forming a gate oxide film over said the exposed semiconductor substrate in said trench and said high density channel region;

depositing a polysilicon film entirely over said gate oxide film;

pattering said polysilicon film to form a gate electrode of predetermined size on said gate oxide film atop said trench and its external surroundings, said polysilicon film extending differently to the external surroundings and thus, being asymmetrical;

doping said high density channel region with high density impurities having a type different from that of said semiconductor substrate 1 so as to form a source region and a drain region and so as not to implant said different impurities in the high density channel portion of said semiconductor substrate formed below the longer extended portion of said gate electrode, said drain region being neighboring said high density channel portion.

2. A method according to claim 1, wherein said high density channel region is formed when impurity ions are implanted in said semiconductor substrate at a high density in order to control a threshold voltage.

* * * * *

UNITED STATES PATENT AND TRADEMARK OFFICE
CERTIFICATE OF CORRECTION

PATENT NO. : 5,376,570  Page 1 of 2

DATED : December 27, 1994

INVENTOR(S) : Dae S. Jung et al.

It is certified that error appears in the above-identified patent and that said Letters Patent is hereby corrected as shown below:

Abstract, line 2, replace "An" with --A--.

Abstract, line 8, following "and" insert --its--.

Abstract, line 9, following "other" delete "than".

Column 1, line 11, replace "an" with --a--.

Column 1, line 50, replace "an" with --a--.

Column 2, line 55, replace "an" with --a--.

Column 1, line 31, replace "nigher" with --higher--.

Column 1, line 36, following "cannot" insert --be--.

Column 1, line 63, following "other" delete "than".

Column 2, line 65, following "other" delete "than".

Column 2, line 22, replace "pattering" with --patterning--.

Column 2, line 23, replace "pattering" with --patterning--.

Column 3, line 49, replace "separated much" with --separated by much more--.

Column 3, line 50, following "separated" insert --by--.

UNITED STATES PATENT AND TRADEMARK OFFICE
CERTIFICATE OF CORRECTION

PATENT NO. : 5,376,570

DATED : December 27, 1994

INVENTOR(S) : Dae S. Jung, et al

It is certified that error appears in the above-indentified patent and that said Letters Patent is hereby corrected as shown below:

Column 4, line 39, replace "pattering" with --patterning--.

Signed and Sealed this

Sixteenth Day of January, 1996

Attest:

BRUCE LEHMAN

Attesting Officer      Commissioner of Patents and Trademarks